United States Patent [19]

Snook et al.

[11] Patent Number: 4,563,636
[45] Date of Patent: Jan. 7, 1986

[54] CONNECTION VERIFICATION BETWEEN CIRCUIT BOARD AND CIRCUIT TESTER

[75] Inventors: Matthew L. Snook; John E. McDermid; William J. Nicolay, all of Loveland, Colo.

[73] Assignee: Hewlett-Packard Company, Palo Alto, Calif.

[21] Appl. No.: 560,474

[22] Filed: Dec. 12, 1983

[51] Int. Cl.⁴ .............................................. G01R 19/00
[52] U.S. Cl. ......................................... 324/66; 324/51; 324/73 PC; 324/158 F
[58] Field of Search ........... 324/66, 51, 73 PC, 158 P, 324/158 F, 72.5; 179/175.3 F

[56] References Cited

U.S. PATENT DOCUMENTS

| | | | |
|---|---|---|---|
| 3,792,349 | 2/1974 | Bobbitt | 324/51 |
| 3,867,692 | 2/1975 | Esch | 324/66 |
| 4,074,188 | 2/1978 | Boatman et al. | 324/73 PC X |

Primary Examiner—Stanley T. Krawczewicz
Attorney, Agent, or Firm—Douglas L. Weller

[57] ABSTRACT

An apparatus and a method is provided for verifying electrical coupling between a first contact point of an electrical device on a circuit board and a first connection pin, on a board tester. Within the tester, a JK flip-flop is electrically coupled to the first connection pin through an amplifier. A Q output of the JK flip-flop is initialized to a logic 0. An electrical probe with an electrical voltage is stroked across the first contact point and any other contact points on the circuit. If the first contact point is electrically coupled to the first connection pin, a logic 1 will be held on the Q output of the JK flip-flop. If there is no electrical coupling, then a logic 0 will be held on the Q output. By reinitializing the JK flip-flop and electrically coupling it to another connection pin, electrical coupling between another contact point and another connection pin may be tested.

6 Claims, 3 Drawing Figures

CONNECTION VERIFICATION BETWEEN CIRCUIT BOARD AND CIRCUIT TESTER

BACKGROUND

To assure quality, circuit boards produced for commercial consumption are often subject to vigorous testing. One scheme for circuit board testing requires the placing of a circuit board on a circuit tester. The circuit tester has a connection surface consisting of an array of pin-shaped connectors called a "bed of nails". The pin-shaped connectors are placed on springs so that a template may be placed on top of the array of pin-shaped connectors depressing some of the connectors and allowing only selected connectors to pass through the the template. The circuit board may then be placed on the bed of nails so that the pin-shaped connectors make electrical contact between the circuit board and the circuit tester at selected contact points on the circuit board where the pin-shaped connectors pass through the template. Once electrical connection is made, the circuit tester can couple electronic signals to the circuit board verifying that the circuit board functions correctly.

Occasionally, proper connection between the circuit board and the circuit tester is not established at all selected contact points. When this happens the circuit tester is unable to couple electronic signals properly to the circuit board, which may result in an incorrect determination that the circuit board is defective. In order to circumvent this difficulty, verification of electrical connection between the circuit board and circuit tester can be performed.

One method to verify electrical connection is to place a first electrical probe on a contact point on the circuit board and a second electrical probe on a connection pin which should be electrically coupled to the contact point. Once these probes are in place the impedance between the two probes can be measured to determine whether electrical contact has been established. This method, however, is time-consuming as an operator would first need to determine which contact points are supposed to be coupled to which connection pins. Furthermore, once an appropriate contact point and a corresponding connection pin are discovered, placing of the first and second probes on the selected contact point and connection needs to be done simultaneously in order to determine whether they are electrically coupled.

SUMMARY OF THE INVENTION

In accordance with the preferred embodiment of the present invention, an apparatus and a method are provided for verifying electrical coupling between a first contact point on a circuit board and a first connection pin on a board tester. Within the tester, a sample and hold circuit, e.g. a ones catcher, is electrically coupled to the first connection pin. The sample and hold circuit is initialized to a first electrical voltage. An electrical probe with a second electrical voltage is stroked across a plurality of contact points including the first contact point. If the first contact point is electrically coupled to the first connection pin, a third electrical voltage will be held on an output of the sample and hold circuit. If there is no electrical coupling, then the first electrical voltage will be held on the output of the sample and hold circuit. By reinitializing the sample and hold circuit and electrically coupling it to a second connection pin, electrical coupling between a second contact point and a second connection pin may be tested.

DESCRIPTION OF THE PREFERRED EMBODIMENT

Figure 2:
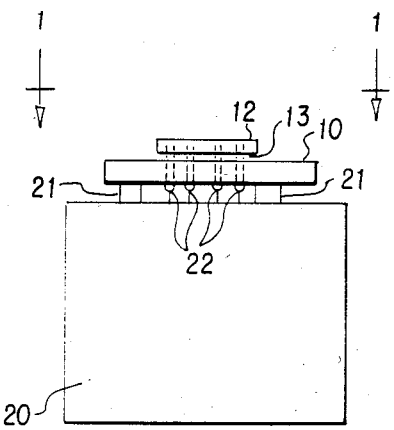
FIG. 2 is a side view of FIG. 1 showing a circuit board, electrical leads within a device on the circuit board, a circuit board tester, and a series of connection pins forming a "bed of nails" in accordance with a preferred embodiment of the present invention.
Figure 3:
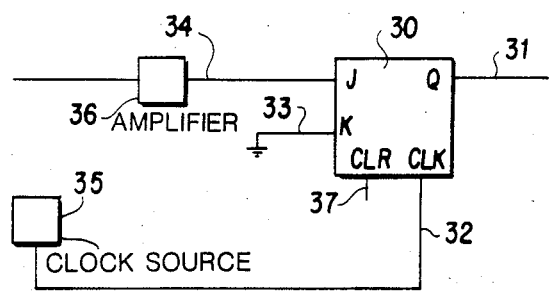
FIG. 3 shows a JK flip-flop utilized as a ones catcher in accordance with the preferred embodiment of the present invention.

FIG. 2 shows a circuit tester 20 with a "bed of nails" formed by a series of connection pins 21. A circuit board 10 is placed on connection pins 21. A series of contact points, e.g., a series of electrical leads 13 of a device 12, are electrically coupled to connection pins 21 at a series of electrical nodes 22.

In order to determine whether a first connection pin of connection pins 21, is electrically coupled to a first lead of electrical leads 13, tester 20 selects the first connection pin from connection pins 21. The first connection pin is electrically coupled to a J input 34 of a flip-flop 30 through an amplifier 36. Flip-flop 30 functions as a sample and hold circuit. A sample and hold circuit is a circuit that is initialized at an output to a first electrical voltage. The sample and hold circuit then periodically samples the input. If a second electrical voltage is placed on the input, the sample and hold circuit changes the output to a third electrical voltage. The sample and hold circuit then holds the third electrical voltage regardless of the value on the input, until the sample and hold circuit is reinitialized to the first electrical voltage.

Flip-flop 30 is particular kind of sample and hold circuit known as a ones catcher. A ones catcher is a sample and hold circuit in which the first electrical voltage is a logic 0, e.g. 0 volts, and the second and third electrical voltages are logic 1, e.g. 5 volts. Flip-flop 30 has a Q output 31 which can be initialized to logic 0 by a Clear (CLR) input 37. A K input 33 is grounded, e.g., held at 0 volts.

Figure 1:
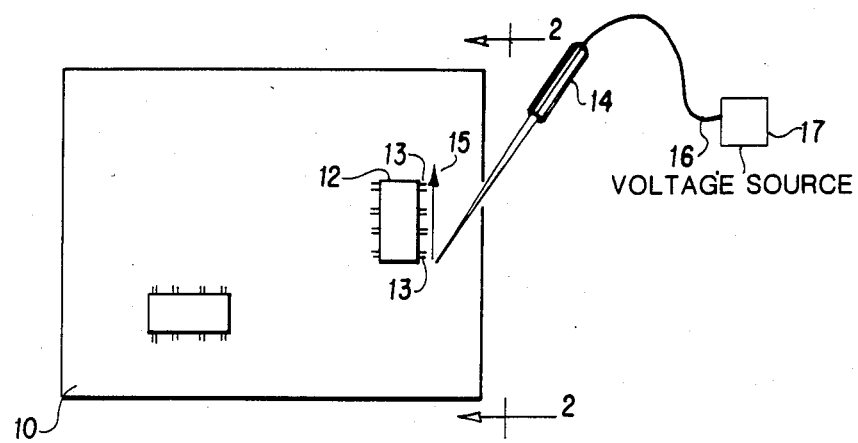
FIG. 1 shows a circuit board, electrical leads within a device on the circuit board, and an electrical probe in accordance with a preferred embodiment of the present invention.

As shown in FIG. 1, an electrical probe 14 is temporarily coupled to each lead of electrical leads 13 by stroking probe 14 across electrical leads 13, for instance, in a direction 15. The voltage on probe 14 is set at, for example 0.3 volts by being electrically coupled to a voltage source 17 through a wire 16. Each lead of electrical leads 13 is raised to 0.3 volts for a first duration of time in which probe 14 makes contact with it.

If the first connection pin of connection pins 21 is electrically coupled to the first lead of electrical leads 13, then amplifier 36 will raise input 34 to a logic 1 for the first duration of time in which probe 14 makes contact with the first lead. A clock input 32 of flip-flop 30, is connected to a clock source 35. Clock source 35 generates clock pulses at a frequency, for example 2 megahertz, sufficient to insure that at least one clock pulse reaches flip-flop 30 during the first duration. During the first duration and at reception of a clock pulse, flip-flop 30 "sees" the logic 1 on input 34 and puts a logic 1 on output 31. Output 31 then holds the logic 1 until reinitialized by circuit tester 20 or an operator. If the first connection pin is not electrically coupled to the first lead, then amplifier will not raise input 34 to logic 1 and output 31 will remain at logic 0.

The previous discussion assumed the use of a ones catcher for a sample and hold circuit. Other types of sample and hold circuits may be used, e.g., a zeros catcher, where the first electrical voltage is a logic 1 and the second and third electrical voltages are logic 0.

Furthermore, more than one sample and hold circuit may be used at one time. For example, a second connection pin of connection pins 21 may be electrically coupled to a second ones catcher, so that when probe 14 is stroked across electrical leads 13 the second ones catcher will concurrently verify whether the second connection pin is electrically coupled to a second lead of electrical leads 13.

What is claimed is:

1. A method of verifying electrical coupling between a first contact point on a circuit board, and a connection pin on another device, the method comprising:
   temporarily coupling a first electrical voltage to a plurality of contact points the plurality of contact points including the first contact point;
   detecting a second electrical voltage on the connection pin; and,
   storing a third electrical voltage, wherein the value of the third electrical voltage varies depending on whether the second electrical voltage equals the first electrical voltage.

2. A method as in claim 1 wherein temporarily coupling a first electrical voltage to the plurality of contact points comprises:
   initializing a probe to the first electrical voltage; and
   stroking the probe across the plurality of contact points.

3. An apparatus for verifying electrical coupling between a contact point and a connection pin, the apparatus comprising:
   a probing means, temporarily coupled to a first of the contact point and the connection pin, for temporarily changing the electrical voltage on the the first of the contact point and the connection pin;
   a storing means, coupled to a second of the contact point and the connection pin, for detecting and storing a voltage change on the second of the contact point and the connection pin, wherein the storing means stores a first voltage if the contact point and the connection pin are electrically coupled, and a second voltage if the contact point and the connection pin are not electrically coupled.

4. An apparatus as in claim 3 wherein the first of the contact point and the connection pin is the contact point, the second of the contact point and the connection pin is the connection pin and the apparatus further comprises a plurality of contact points including the first contact point, wherein the probing means is stroked across the plurality of contact points, being independently, temporarily, and electrically coupled to each of the plurality of contact points.

5. An apparatus as in claim 4 additionally comprising:
   a second connection pin mechanically coupled to the first connection pin but not electrically coupled to the first connection pin; and
   a second storing means, electrically coupled to the second connection pin, for detecting and storing a voltage change on the second connection pin; and
   wherein the plurality of contact points includes a second contact point wherein the second storing means stores the first voltage if the second contact point and the second connection pin are electrically coupled, and the second voltage if the second contact point and the second connection pin are not electrically coupled.

6. An apparatus as in claim 3 wherein the first of the contact point and the connection pin is the connection pin, the second of the contact point and the connection pin is the contact point and the apparatus further comprises a plurality of connection pins including the first connection pin, wherein the probing means is stroked across the plurality of connection pins, being independently, temporarily, and electrically coupled to each of the plurality of connection pins.

* * * * *